United States Patent
Iyama et al.

(10) Patent No.: US 8,903,666 B2
(45) Date of Patent: Dec. 2, 2014

(54) ABSORBED POWER MEASURING METHOD, LOCAL AVERAGE ABSORBED POWER MEASURING METHOD, LOCAL AVERAGE ABSORBED POWER CALCULATING APPARATUS, AND LOCAL AVERAGE ABSORBED POWER CALCULATING PROGRAM

(75) Inventors: Takahiro Iyama, Yokohama (JP); Teruo Onishi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 459 days.

(21) Appl. No.: 13/201,373

(22) PCT Filed: Jan. 29, 2010

(86) PCT No.: PCT/JP2010/051199
§ 371 (c)(1),
(2), (4) Date: Aug. 12, 2011

(87) PCT Pub. No.: WO2010/100983
PCT Pub. Date: Sep. 10, 2010

(65) Prior Publication Data
US 2011/0301886 A1 Dec. 8, 2011

(30) Foreign Application Priority Data

Mar. 3, 2009 (JP) ................................ 2009-049956
Jul. 15, 2009 (JP) ................................ 2009-166932

(51) Int. Cl.
*G01R 29/00* (2006.01)
*G01R 29/08* (2006.01)

(52) U.S. Cl.
CPC ........ *G01R 29/0857* (2013.01); *G01R 29/0892* (2013.01)
USPC ........................................... 702/60; 343/703

(58) Field of Classification Search
CPC ..................... G01R 29/0857; G01R 29/0892
USPC ............................................. 702/60; 343/703
See application file for complete search history.

(56) References Cited

U.S. PATENT DOCUMENTS 7,072,325 B1 * 7/2006 Sato .............................. 370/342
7,186,377 B2    3/2007 Iyama et al.
(Continued)

FOREIGN PATENT DOCUMENTS

JP      2003 322668     11/2003
JP      3809166          5/2006
(Continued)

OTHER PUBLICATIONS

Machine translation for JP 2008-249394.*

(Continued)

*Primary Examiner* — Andrew Schechter
*Assistant Examiner* — John Kuan
(74) *Attorney, Agent, or Firm* — Oblon, Spivak, McClelland, Maier & Neustadt, L.L.P.

(57) ABSTRACT

An object of the present invention is to provide a simple way of measuring the local average absorbed power of a radio device having a plurality of antennas. A local average absorbed power measuring method of the present invention has an individual measurement step and a calculation step. In the calculation step, local average absorbed power candidates are obtained while weights are being varied. In a local average absorbed power candidate calculation sub-step, the absorbed power distribution in three-dimensional space is calculated from the combined electric field or combined magnetic field obtained in the combination sub-step, and a local average absorbed power candidate is obtained. In a local average absorbed power selection step, the highest one of the local average absorbed power candidates is specified.

22 Claims, 14 Drawing Sheets

(56) References Cited

U.S. PATENT DOCUMENTS

| | | | |
|---|---|---|---|
| 7,511,511 B2* | 3/2009 | Onishi et al. | 324/632 |
| 7,615,188 B2* | 11/2009 | Iyama et al. | 422/50 |
| 7,683,632 B2* | 3/2010 | Kiminami et al. | 324/632 |
| 2004/0104843 A1 | 6/2004 | Mimura et al. | |
| 2004/0232776 A1* | 11/2004 | Ozaki et al. | 307/149 |
| 2005/0101315 A1* | 5/2005 | Yamaguchi et al. | 455/423 |
| 2006/0172432 A1* | 8/2006 | Iyama et al. | 436/149 |
| 2007/0236229 A1* | 10/2007 | Onishi et al. | 324/632 |
| 2008/0265902 A1* | 10/2008 | Kiminami et al. | 324/457 |
| 2010/0203862 A1* | 8/2010 | Friedlander et al. | 455/404.1 |

FOREIGN PATENT DOCUMENTS

| | | |
|---|---|---|
| JP | 2007 78482 | 3/2007 |
| JP | 2008 249394 | 10/2008 |

OTHER PUBLICATIONS

Machine translation for JP 2007-078482.*

Borup et al., "Fast-Fourier-Transform Method for Calculation of SAR Distributions in Finely Discretized Inhomogeneous Modes of Biological Bodies" IEEE Transactions on Microwave Theory Andtechniquevso, L 32, No. 4, Apr. 1984, pp. 355-360.*

Mahmoud et al., "Investigating the Interaction Between a Human Head and a Smart Handset for 4G Mobile Communication Systems" Progress in Electromagnetics Research C, vol. 2, 169-188, 2008.*

Notification of Reasons for Rejection issued Dec. 18, 2012 in Japanese Patent Application No. 2011-502688 (with English translation).

Combined Chinese Office Action and Search Report issued on Jan. 22, 2013, in Chinese patent Application No. 201080010361.4 with English translation.

Office Action issued Jun. 5, 2013, in Canadian Patent Application No. 2,752,570.

International Search Report issued Apr. 20, 2010 in PCT/JP10/051199 filed Jan. 29, 2010.

IEC 62209-1, "Human exposure to radio frequency fields from hand-held and body-mounted wireless communication devices—Human models, instrumentation, and procedures—," International Standard, pp. 2-215, (Feb. 2005).

Iyama, T., et al., "SAR Measurement Procedure for Multi-antenna Transmitters," EMC'09/Kyoto, 21S4-2, pp. 249-252, (Jul. 2009).

Office Action issued May 2, 2014 in Canadian Patent Application No. 2,752,570.

"Human exposure to radio frequency fields from hand-held and body-mounted wireless communication devices—human models, instrumentation, and procedures", IS/IEC 62209-1:2005, International Standard, Bureau of Indian Standards, Mar. 2012, pp. 1-101 with cover pages, corresponds to another version that was previously filed on Aug. 12, 2011.

* cited by examiner

ABSORBED POWER MEASURING METHOD, LOCAL AVERAGE ABSORBED POWER MEASURING METHOD, LOCAL AVERAGE ABSORBED POWER CALCULATING APPARATUS, AND LOCAL AVERAGE ABSORBED POWER CALCULATING PROGRAM

TECHNICAL FIELD

The present invention relates to an absorbed power measuring method of measuring, with an electric and/or magnetic probe, the electric field strength or magnetic field strength of radio waves emitted from a radio device to a phantom, which simulates the dielectric properties of the human body, the electric and/or magnetic probe being disposed in the phantom; an absorbed power calculating apparatus; a local average absorbed power measuring method of using the former method to obtain the average absorbed power in a local place (local average absorbed power) where power absorbed by the human body (absorbed power) becomes the highest; a local average absorbed power calculating apparatus; and programs for causing a computer to operate as these apparatuses.

BACKGROUND ART

Conventionally, when power absorbed by the human head is measured, a head phantom simulating the dielectric properties of the human head is constructed, power absorbed by the phantom is measured, and power absorbed by the human head is estimated. A measuring method described in non-patent literature 1 or the like has been used. Apparatuses for easily implementing this type of measuring method have also been proposed (patent literature 1 and 2).

Typical conventional art will be described with reference to FIGS. 1 to 3. FIG. 1 is a view showing the placement of components in conventional local average absorbed power measuring methods. FIG. 2 is a view showing the flow of a first conventional local average absorbed power measuring method. FIG. 3 is a view showing the flow of a second conventional local average absorbed power measuring method. In FIG. 1, an antenna 810 of a radio device (not shown) is placed on the y-axis, and a rectangular parallelepiped phantom 920 is disposed a given distance away in the y-axis direction. An electric and/or magnetic probe 910 measures the electric field strength or magnetic field strength of radio waves in a part where the tip is positioned. The phantom may have the shape of the human head. The axes can be oriented in given directions.

In the first conventional local average absorbed power measuring method (FIG. 2), absorbed power is measured at a plurality of measurement points $921_{mn}$ (m is an integer from 1 to M, and n is an integer from 1 to N) in a two-dimensional plane 921 at a given distance inward from the surface of the phantom 920 on the side of the antenna 810 (S911). Then, absorbed power is measured at a plurality of measurement points in a three-dimensional space 925 that includes the measurement point $921_{mn}$ where the absorbed power becomes the highest (S912). The measurement points are set at smaller intervals in the measurement in the three-dimensional space 925 than in the measurement in step S911. The size of the small intervals should be determined in accordance with the required measurement accuracy. Then, the average absorbed power in a local place (local average absorbed power) near the point where the absorbed power becomes the highest is obtained (S913).

In the second conventional local average absorbed power measuring method (FIG. 3), the amplitude and phase of the electric field or magnetic field are measured at a plurality of measurement points $921_{mn}$ (m is an integer from 1 to M, and n is an integer from 1 to N) in a two-dimensional plane 921 at a given distance inward from the surface of the phantom 920 on the side of the antenna 810 (S921). The distribution of absorbed power in the three-dimensional space 925 is calculated by using an equivalence theorem or the like (S922). From the calculated distribution of absorbed power in the three-dimensional space 925, the local average absorbed power is obtained (S923).

To simplify the description given below, the entire processing flow (S911 to S913) of the first conventional local average absorbed power measuring method will be referred to as step S910, and the entire processing flow (S921 to S923) of the second conventional local average absorbed power measuring method will be referred to as step S920.

A local average absorbed power measuring method in patent literature 2 has a determination step, and a local average absorbed power measurement step or a local absorbed power calculation step. In the determination step, measurement points, and a combination of transmission powers and phases of individual antennas or a combination of transmission powers of the antennas are determined in advance, and then, a combination of transmission powers and phases of the antennas or a combination of transmission powers of the antennas for obtaining the local average absorbed power is determined by using the measurement results. In the local average absorbed power measurement step or local average absorbed power calculation step, the local average absorbed power is measured or calculated with the combination determined in the determination step.

PRIOR ART LITERATURE

Patent Literature

Patent literature 1: Japanese Registered Patent No. 3809166
Patent literature 2: Japanese Patent Application Laid Open No. 2008-249394

Non-Patent Literature

Non-patent literature 1: IEC/PT62209, "Procedure to Determine the Specific Absorption Rate (SAR) for Hand-Held Mobile Telephones."

DISCLOSURE OF THE INVENTION

Problems to be Solved by the Invention

The conventional local average absorbed power measuring methods described as the conventional art are premised on measurement for a single antenna. A local average absorbed power measuring method for a radio device having a plurality of antennas $310_k$ that are used simultaneously in the same frequency band, as shown in FIG. 4, has not been defined especially. The mutual coupling of the antennas can change the overall directional characteristics of the antennas, and the result can vary greatly from the result obtained with a single antenna. When the conventional methods are used to measure the local average absorbed power of a radio device having a plurality of antennas that are used simultaneously in the same frequency band, step S910 or S920 must be repeated for a variety of combinations of transmission powers and phases of the antennas, which requires a very long time.

The local average absorbed power measuring method of patent literature 2 is one method that solves the problem described above. The method repeats the processing while varying the combination of transmission powers and phases of the antennas or the combination of transmission powers of the antennas and selects a combination that is estimated to provide the highest local average absorbed power. However, the measurement or calculation of local average absorbed power is not repeated. Therefore, there is a possibility of missing a combination that actually provides the highest local average absorbed power.

An object of the present invention is to provide a simple method of measuring the local average absorbed power of a radio device having a plurality of antennas.

Means to Solve the Problems

A local average absorbed power measuring method of the present invention relates to an absorbed power measuring method of measuring, with an electric and/or magnetic probe, the electric field strength or magnetic field strength of radio waves emitted to a phantom, which simulates the dielectric properties of the human body, from a radio device having a plurality of antennas that are used simultaneously in an identical frequency band, the electric and/or magnetic probe being disposed in the phantom, and a method of using the former method to obtain the average absorbed power in a local place (local average absorbed power) where power absorbed by the phantom (absorbed power) becomes the highest.

In a local average absorbed power measuring method shown in FIG. 5, measurement points are disposed three-dimensionally, and the amplitude and phase of the electric field or magnetic field of each one of a plurality of antennas that emit radio waves of the same frequency are measured at the predetermined measurement points, in an individual measurement step. In a calculation step, by repeating a combination sub-step and a local average absorbed power candidate calculation sub-step while varying weights, a plurality of local average absorbed power candidates are obtained. In the combination sub-step, the amplitudes and phases of the electric fields or magnetic fields of the individual antennas are combined. In the local average absorbed power candidate calculation sub-step, a three-dimensional absorbed power distribution corresponding to the weights is calculated, and the local average absorbed power corresponding to the weights is obtained as a local average absorbed power candidate. In a local average absorbed power selection step, the highest one of the local average absorbed power candidates corresponding to the weights is selected.

In a local average absorbed power measuring method in FIG. 9, in an individual measurement step, measurement points are disposed two-dimensionally in a plane at a given distance from a surface of a phantom, and the amplitude and phase of the electric field or magnetic field of each one of a plurality of antennas that emit radio waves of the same frequency are measured at the predetermined measurement points. In a calculation step, by repeating a combination sub-step and a local average absorbed power candidate calculation sub-step while varying weights, a plurality of local average absorbed power candidates are obtained. In the combination sub-step, the amplitudes and phases of the electric fields or magnetic fields of the individual antennas are combined two-dimensionally. In the local average absorbed power candidate calculation sub-step, a three-dimensional absorbed power distribution on the other side of the antennas, as viewed from the two-dimensional plane, in the phantom is obtained from the information of the two-dimensional combined electric field or combined magnetic field, and the local average absorbed power corresponding to the weights is obtained as a local average absorbed power candidate. In a local average absorbed power selection step, the highest one of the local average absorbed power candidates corresponding to the weights is selected.

In each of local average absorbed power measuring methods in FIGS. 14 and 15, the local average absorbed power corresponding to weights determined in a local average absorbed power selection step is measured. The measuring method does not need to be restricted to the method used in the individual measurement steps.

In each of local average absorbed power measuring methods in FIGS. 17 and 18, the difference between the calculated value of the local average absorbed power corresponding to weights, determined in a local average absorbed power selection step, and the measured value thereof is accumulated, the calculated value of the local average absorbed power obtained in the local average absorbed power selection step is corrected in accordance with the accumulated data, and the result is specified as the local average absorbed power of the radio device. By accumulating the differences between the calculated values and the measured values, the reliability of the calculated value of the local average absorbed power can be improved.

In the local average absorbed power candidate calculation sub-steps, the three-dimensional absorbed power distribution should be calculated by using an equivalence theorem. Alternatively, $$E_{est} = -\frac{1}{2\pi} \int_S [\{n \times E_{2d}\} \times \nabla' \phi] dS$$

the above expression may be used to calculate the three-dimensional absorbed power distribution. Alternatively, conversion to wave number space by a Fourier transform or the like may be used to calculate the three-dimensional absorbed power distribution.

The local average absorbed power selection steps may be configured such that local average absorbed power candidates corresponding to weights are obtained, the ratios of the actual operation time periods of the antennas are obtained as weights for the antennas, and an expected value thereof is specified as a time-average local average absorbed power candidate.

In an absorbed power measuring method of the present invention, the amplitude and phase of the electric field or magnetic field of each one of a plurality of antennas that emit radio waves of the same frequency are measured at predetermined measurement points in an individual measurement step. In a combination step, given weights are applied to the amplitudes and phases of the electric fields or magnetic fields of the individual antennas obtained in the individual measurement step, and the results are combined. The absorbed power at the measurement points can be obtained from the amplitude of the combined electric field or combined magnetic field.

Effects of the Invention

With a local average absorbed power measuring method of the present invention, labor can be reduced significantly in comparison with a case in which measurements are performed for all combinations of transmission powers and phases of the antennas. A plurality of local average absorbed power candidates are obtained by not only repeating the processing while varying the combination of transmission powers and phases of the antennas but also repeating the calculation of the local average absorbed power. Therefore, the possibility of missing a combination of transmission powers and phases of the antennas that provides the highest local average absorbed power is reduced. Because the number of measurements can be reduced, the labor and time required for obtaining the local average absorbed power of the radio device are reduced.

DETAILED DESCRIPTION OF THE EMBODIMENTS

Figure 1:
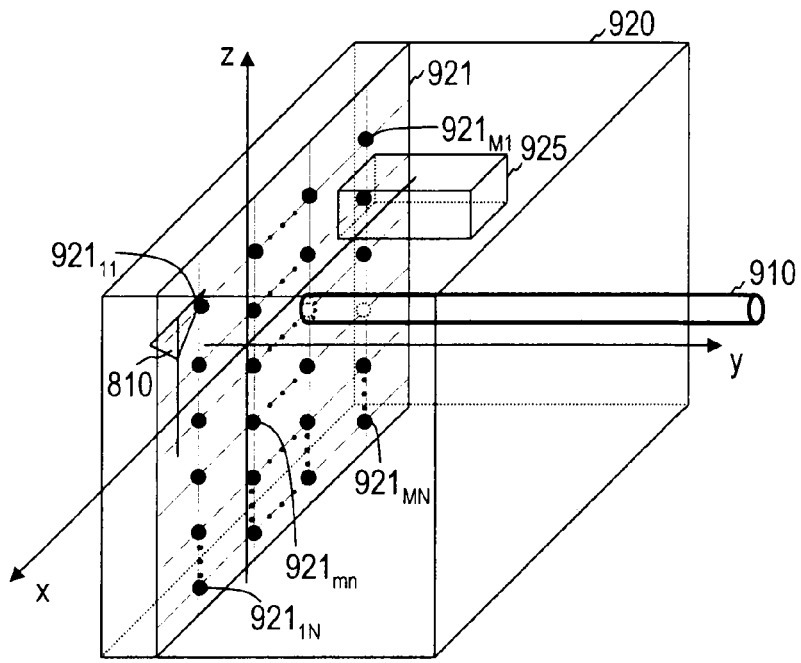
FIG. 1 is a view showing the placement of components in conventional local average absorbed power measuring methods.
Figure 2:
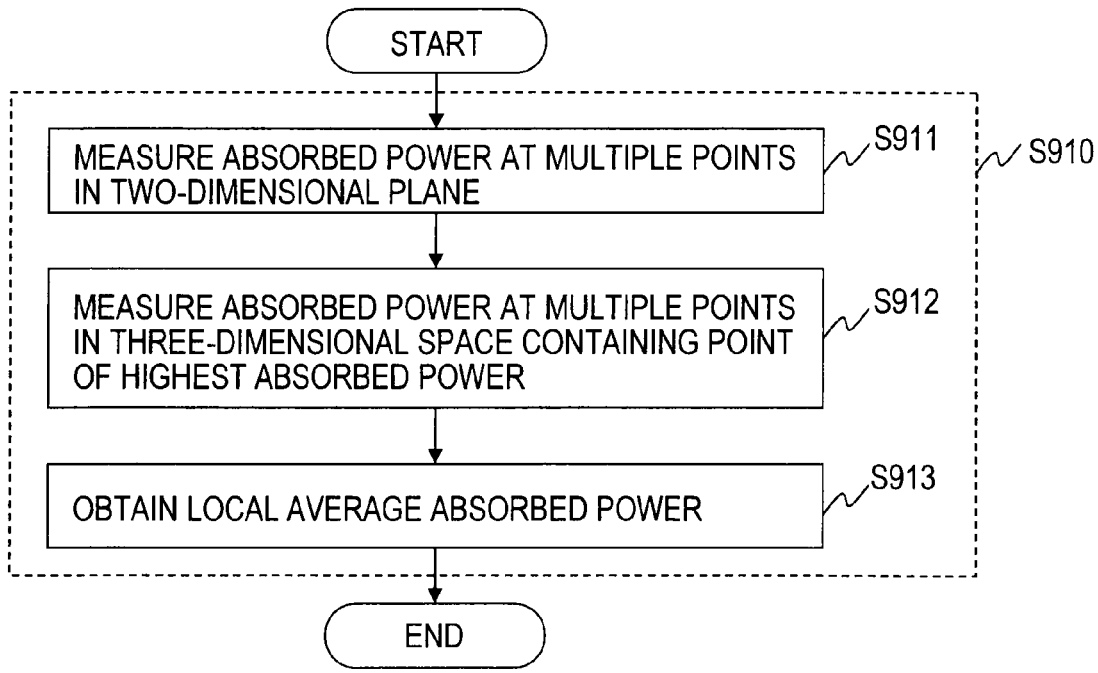
FIG. 2 is a view showing the flow of a first conventional local average absorbed power measuring method.
Figure 3:
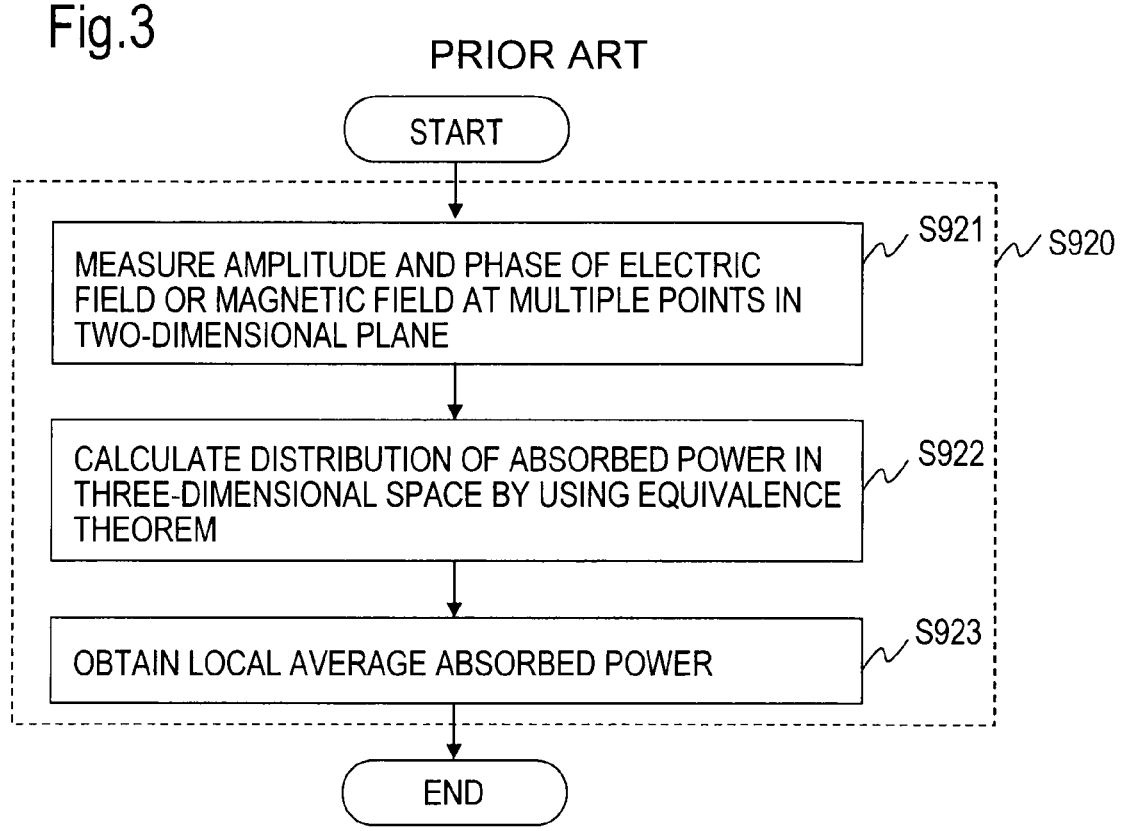
FIG. 3 is a view showing the flow of a second conventional local average absorbed power measuring method.
Figure 4:
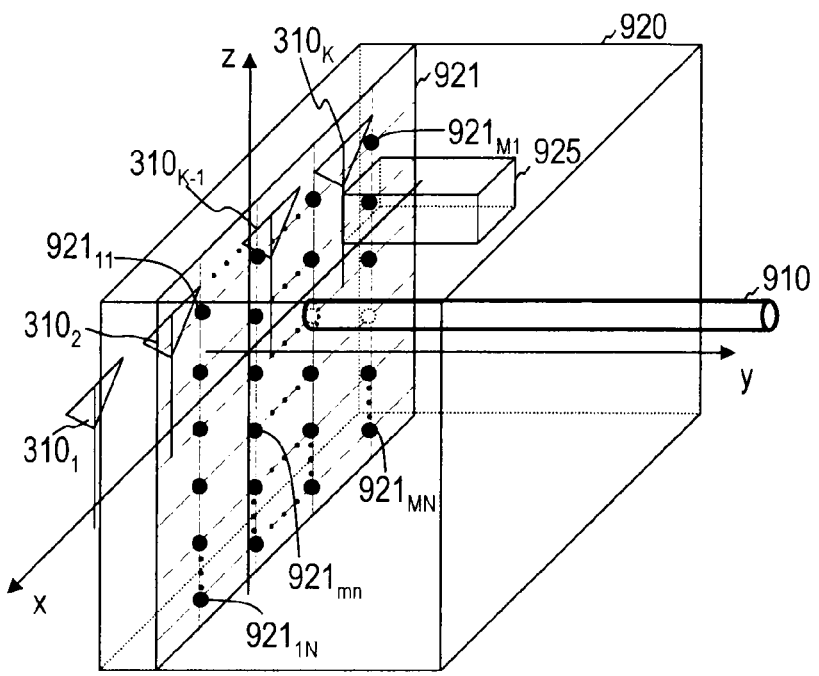
FIG. 4 is a view showing an example using a radio device having a plurality of antennas.

Embodiments will now be described according to the present invention. In order to avoid redundant descriptions, elements having the same function or steps of performing the same processing are given identical reference numerals, and a description thereof will be omitted.

First Embodiment

Figure 5:
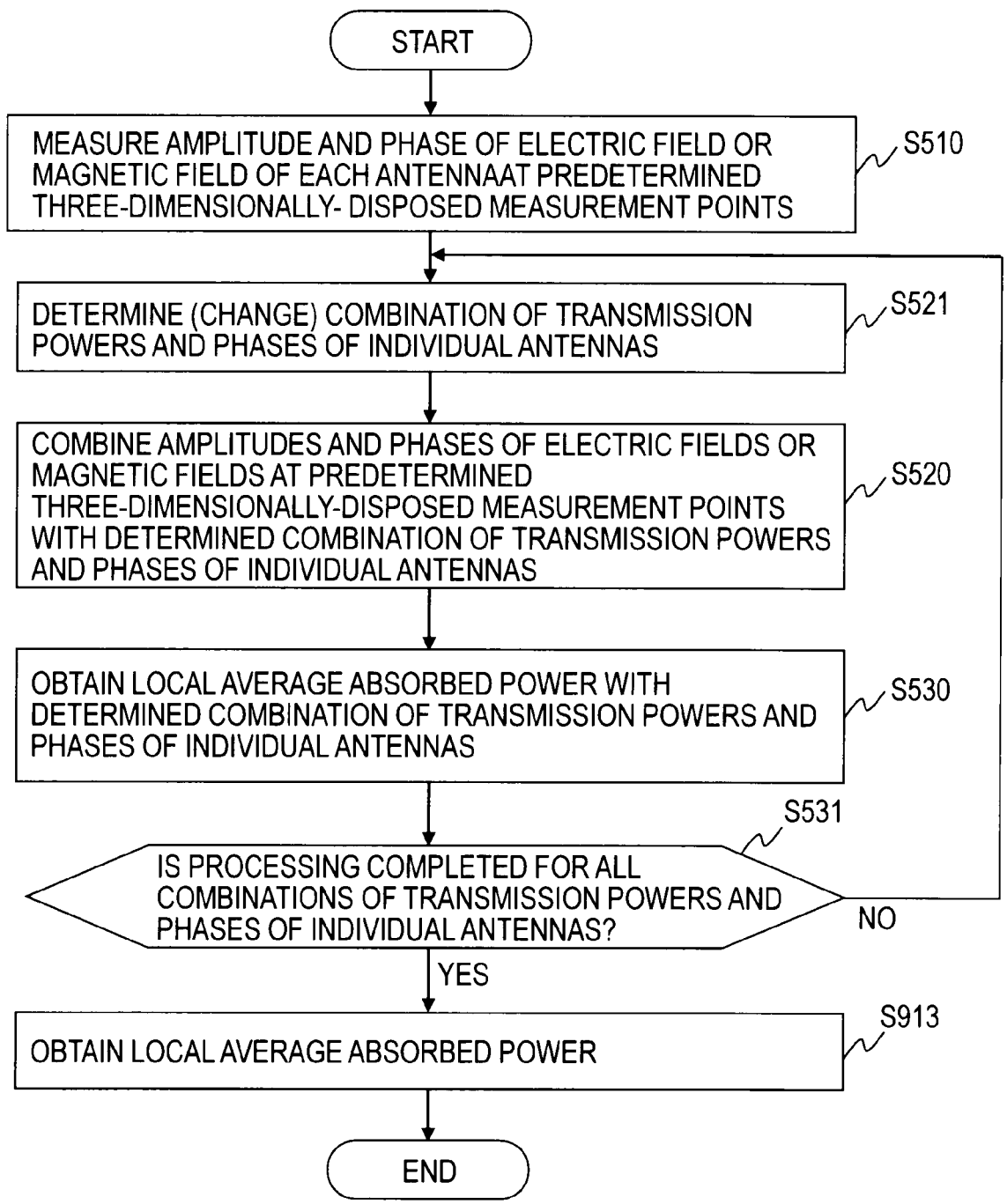
FIG. 5 is a view showing a processing flow according to a first embodiment.
Figure 6:
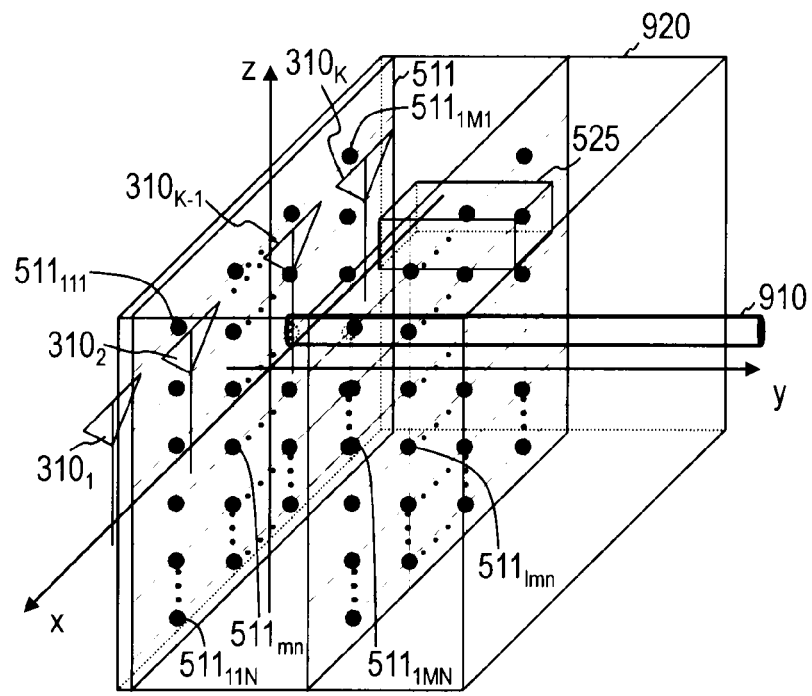
FIG. 6 is a view showing the relationship between measurement points in a phantom and three-dimensional space in the first embodiment.
Figure 7:
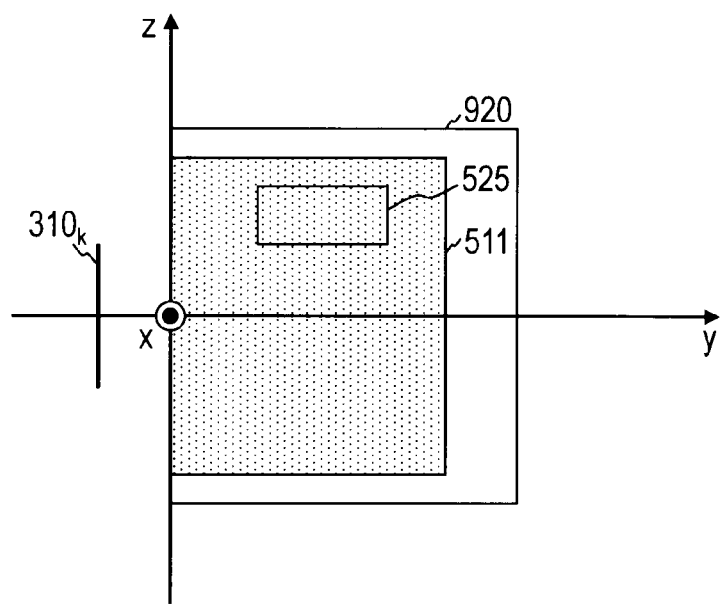
FIG. 7 is a view of FIG. 6 as seen from a direction perpendicular to the yz plane.

FIG. 5 shows a processing flow in a first embodiment. FIG. 6 shows examples of measurement points in a phantom in the first embodiment. FIG. 7 is a view of FIG. 6 as seen from a direction perpendicular to the yz plane. First, each of the antennas $310_k$ radiates RF signal, and an electric and/or magnetic probe 910 is used to measure the amplitude and phase of the electric field or magnetic field at measurement points $511_{lmn}$ disposed three-dimensionally in advance (S510), where k is an integer from 1 to K, l is an integer from 1 to L, m is an integer from 1 to M, and n is an integer from 1 to N. K indicates the number of antennas, L indicates the number of measurement points in the y-axis direction, M indicates the number of measurement points in the x-axis direction, and N indicates the number of measurement points in the z-axis direction. The number of measurement points in the three-dimensional space is L×M×N.

A combination of transmission powers and phases of the individual antennas $310_k$ is determined in a predetermined order (S521). The amplitudes and phases of the electric fields or magnetic fields of the individual antennas $310_k$ are combined to determine the amplitude and phase of the electric field or magnetic field at the measurement points $511_{lmn}$ in accordance with the combination of transmission powers and phases determined in step S521 (S520). The amplitudes and phases of the electric fields or magnetic fields of the antennas at each measurement point can be combined for their individual components after weights are applied. In other words, by calculating the amplitude and phase of the combined electric field or combined magnetic field at each measurement point, the distributions of the amplitude and phase of the three-dimensional electric field or magnetic field corresponding to the given weights and the distribution of absorbed power can be obtained. The amplitudes and phases of the electric fields (or magnetic fields) should be combined as described below, where A1 and φ1 are the amplitude and phase of the electric field, respectively, at observation point P when the antenna $310_1$ alone radiates RF signal, and A2 and φ2 are the amplitude and phase of the electric field, respectively, at observation point P when the antenna $310_2$ alone radiates RF signal. The Combined amplitude A and combined phase φ are as given below.

$$A = \sqrt{X^2 + Y^2}$$

$$\phi = \sin^{-1} \frac{Y}{\sqrt{X^2 + Y^2}}$$

where X=A1 cos φ1+A2 cos φ2 and Y=A1 sin φ1+A2 sin φ2

If they are combined after weights are applied, the calculation is as given below. When the RF signal radiated from the antenna $310_1$ is multiplied by n1, the amplitude A1 is replaced by the following.

$$\sqrt{n1} \times A1$$

Then, the combination given earlier should be made. When the phase is changed by θ1, after replacing phase φ1 with φ1−θ1, the combination given earlier should be made. By replacing amplitude A2 and phase φ2 in the same way, the weights can be changed as desired. If there are three or more antennas, the amplitudes and phases can be combined by repeating the combination described above.

The local average absorbed power corresponding to given weights can also be obtained by the calculation described above. By varying the transmission powers and phases that can be radiated from the individual antennas on a computer, the corresponding local average absorbed power (local average absorbed power candidate) is obtained (S530). Then, it is checked whether the processing for all the predetermined combinations of transmission powers and phases of the antennas $310_k$ has been completed (S531). If the result is No in step S531, the processing returns to step S521, and a different combination is determined. If the result is Yes in step S531, the highest one of the obtained local average absorbed powers (local average absorbed power candidates) is specified as the local average absorbed power (S913).

Figure 8:
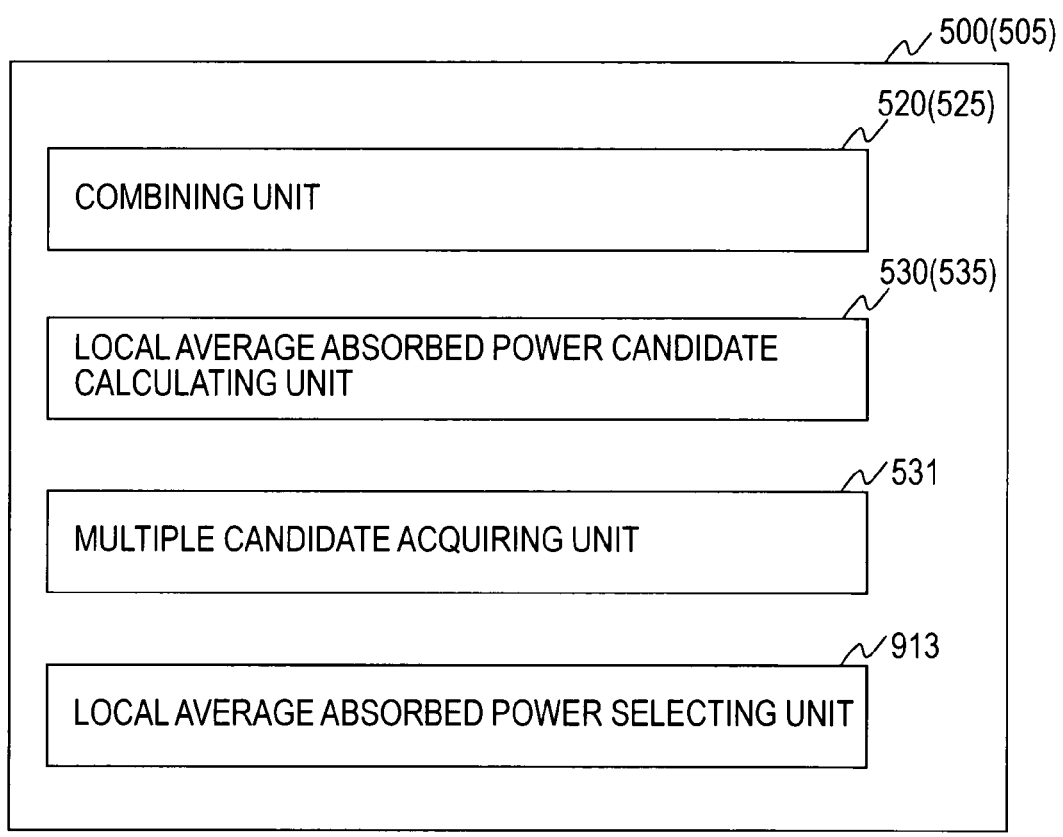
FIG. 8 is a view showing an example functional configuration of a local average absorbed power calculating apparatus that executes a part of the processing flows shown in FIG. 5 and FIG. 9.

FIG. 8 is a view showing an example of the functional configuration of a local average absorbed power calculating apparatus that executes a part of the processing flow shown in FIG. 5. The local average absorbed power calculating apparatus 500 is given the results of measurement of amplitude and phase of the electric field or magnetic field of each one of the plurality of antennas at the measurement points three-dimensionally disposed in the phantom (results of step S510) as input values. The local average absorbed power calculating apparatus 500 includes a combining unit 520, a local average absorbed power candidate calculating unit 530, a multiple candidate acquiring unit 531, and a local average absorbed power selecting unit 913. The combining unit 520 determines a combination of transmission powers and phases of the antennas $310_k$ in a predetermined order, applies predetermined weights to the input values, and combines them (processing in steps S521 and S520). The local average absorbed power candidate calculating unit calculates the distribution of absorbed power in three-dimensional space on the basis of the combined electric field or combined magnetic field obtained by the combining unit 520 and obtains the local average absorbed power in the absorbed power distribution corresponding to the weights as a local average absorbed power candidate (processing in step S530). The multiple candidate acquiring unit obtains a plurality of local average absorbed power candidates by repeating the processing of the combining unit 520 and the processing of the local average absorbed power candidate calculating unit 530, while varying the predetermined weights (corresponding to the processing in step S531). The local average absorbed power selecting unit 913 specifies the highest one of the local average absorbed power candidates as the local average absorbed power of the radio device (processing of step S913). In the description given above, the input values given to the local average absorbed power calculating apparatus 500 are the results of measurement at the measurement points disposed three-dimensionally in the phantom (results of step S510). The input values may also be the amplitudes and phases of the electric fields or magnetic fields at three-dimensionally disposed points, obtained through electromagnetic field simulation, such as the finite-difference time-domain (FDTD) method.

According to the local average absorbed power measuring method of this embodiment, the local average absorbed power can be obtained on the computer just by first measuring the three-dimensional distributions of the electric fields or magnetic fields formed by the individual antennas. Therefore, the labor is reduced greatly in comparison a case in which measurements are performed for all combinations of transmission powers and phases of the antennas. A plurality of local average absorbed power candidates are obtained by not only repeating the processing while varying the combination of transmission powers and phases of the individual antennas but also repeating the calculation of the local average absorbed power. After a combination of transmission powers and phases of the antennas that could provide a large local average absorbed power is found, by calculating the local average absorbed power with a decreased amount of change in transmission power and phase of the individual antennas around this combination, it is possible to reduce the possibility of missing a combination of transmission powers and phases of the individual antennas that would maximize the local average absorbed power.

Second Embodiment

Figure 9:
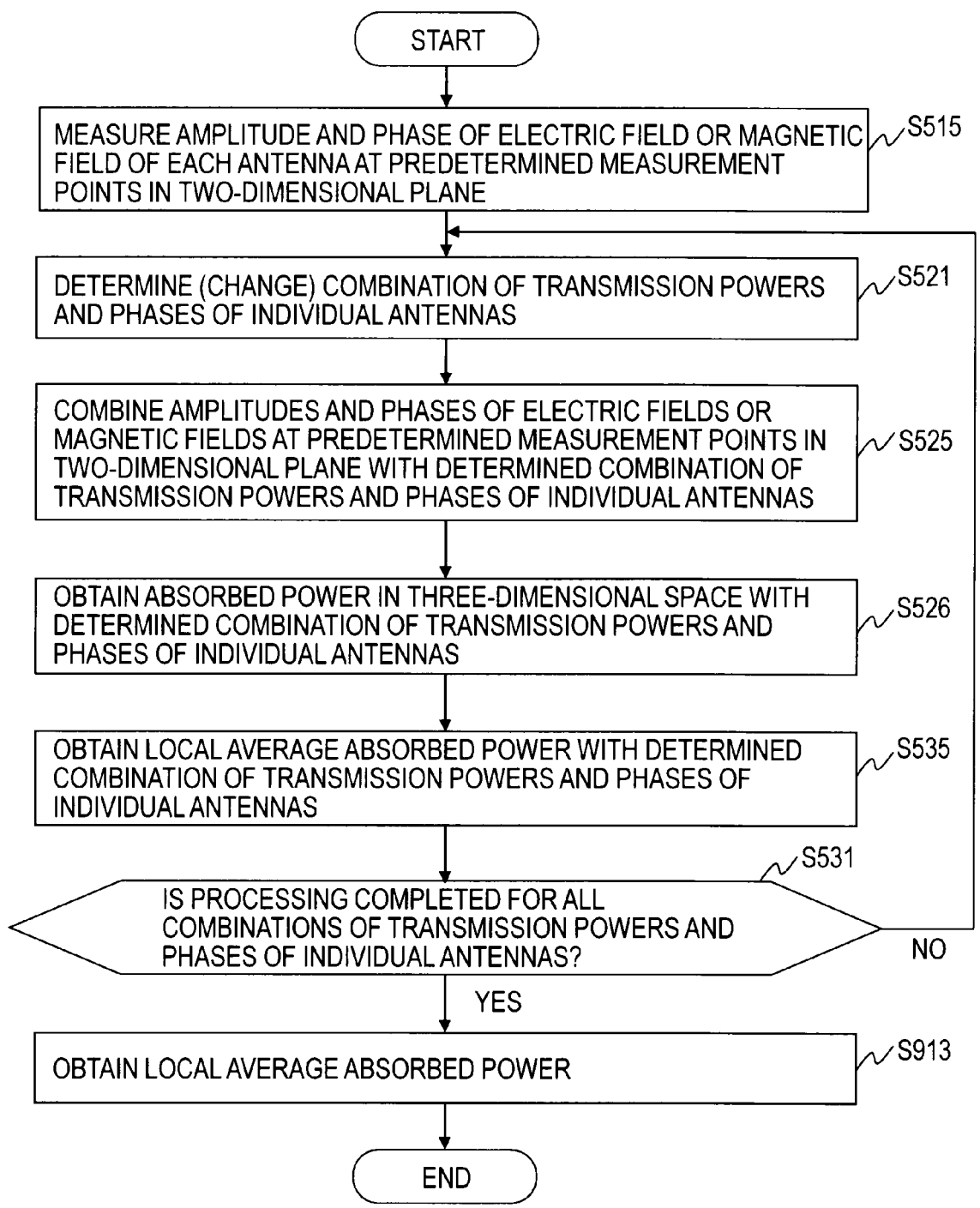
FIG. 9 is a view showing a processing flow according to a second embodiment.
Figure 10:
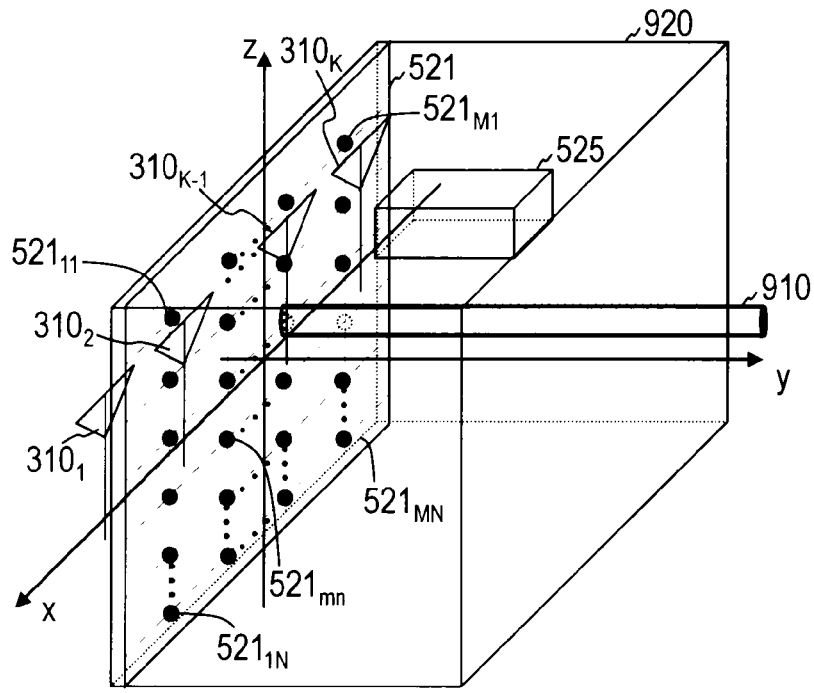
FIG. 10 is a view showing the relationship between measurement points in a phantom and three-dimensional space in the second embodiment.
Figure 11:
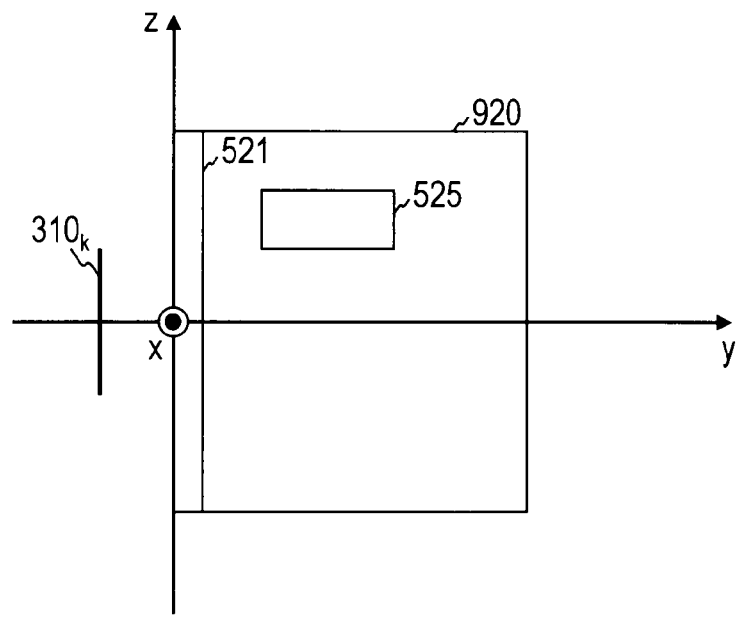
FIG. 11 is a view of FIG. 10 as seen from a direction perpendicular to the yz plane.

FIG. 9 shows a processing flow in a second embodiment. FIG. 10 shows examples of measurement points in a phantom in the second embodiment. FIG. 11 is a view of FIG. 10 seen from a direction perpendicular to the yz plane. First, each of antennas $310_k$ radiates RF signal, and the amplitude and phase of the electric field or magnetic field are measured at measurement points $521_{mn}$ disposed two-dimensionally in advance (S515), where k is an integer from 1 to K, m is an integer from 1 to M, and n is an integer from 1 to N. K indicates the number of antennas, M indicates the number of measurement points in the x-axis direction, and N indicates the number of measurement points in the z-axis direction. The number of measurement points in the two-dimensional plane is M×N.

A combination of transmission powers and phases of the individual antennas $310_k$ is determined in a predetermined order (S521). The amplitudes and phases of the electric fields or magnetic fields of the individual antennas $310_k$ are combined to determine the amplitude and phase of the electric field or magnetic field at the measurement points $521_{mn}$ (S525). The amplitudes and phases of the electric fields or magnetic fields of the antennas at each measurement point can be combined for their individual components after weights are applied, by the method described in the first embodiment. In other words, by calculating the amplitude and phase of the combined electric field or combined magnetic field at each measurement point, the distributions of the amplitude and phase of the two-dimensional electric field or magnetic field corresponding to the given weights can be obtained. On the basis of that, the absorbed power distribution in three-dimensional space on the opposite side of the antenna as viewed from the two-dimensional plane, in the phantom is calculated (S526). As the method, an equivalence theorem can be used, a combination of the equivalence principle and a image theory can be used, conversion to wave number space by a Fourier transform or the like can be used. It is indicated in the Japanese Patent Application Laid Open No. 2008-134218 that if the amplitudes and phases for two components parallel to the two-dimensional plane and not parallel to each other are measured in the measurement of amplitude and phase of the electric field or magnetic field in step S515, the absorbed power distribution in three-dimensional space 920 in step S526 can be calculated. More specifically, by applying the electric field distribution $E_{2d}$ for components on the two-dimensional plane 521 parallel to the two-dimensional plane to Expression (1), a three-dimensional electric field distribution $E_{est}$ is calculated.

$$E_{est} = -\frac{1}{2\pi}\int_S [\{n \times E_{2d}\} \times \nabla' \phi] dS \quad (1)$$

Here, n is a normal vector pointing from the two-dimensional plane 521 in the positive y direction, S is the two-dimensional plane 521, and φ is a Green function defined by the following equation.

$$\phi = \frac{e^{-jk|r-r'|}}{|r-r'|} \quad (2)$$

Figure 12:
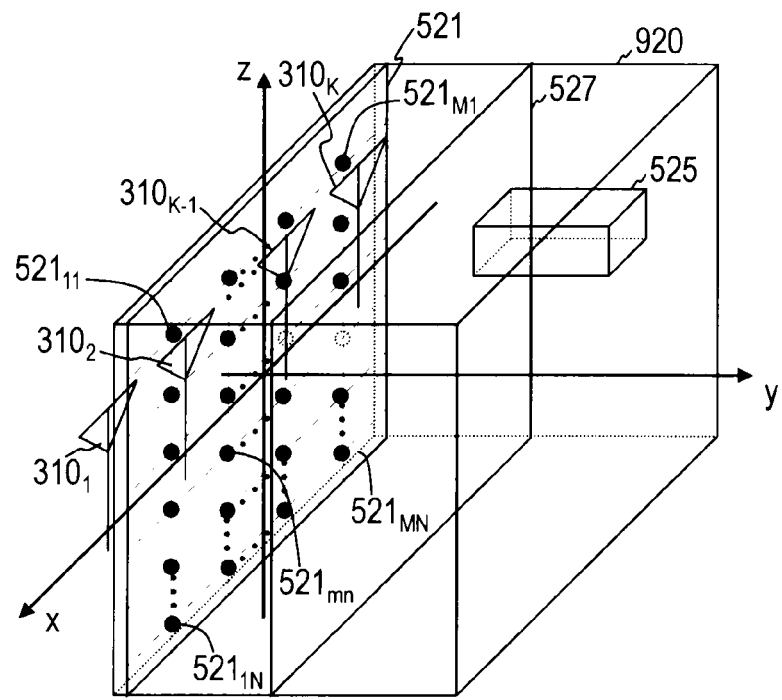
FIG. 12 is a view showing the relationship between the measurement points in the phantom and the three-dimensional space when just two components of the electric field or magnetic field are measured in the second embodiment.
Figure 13:
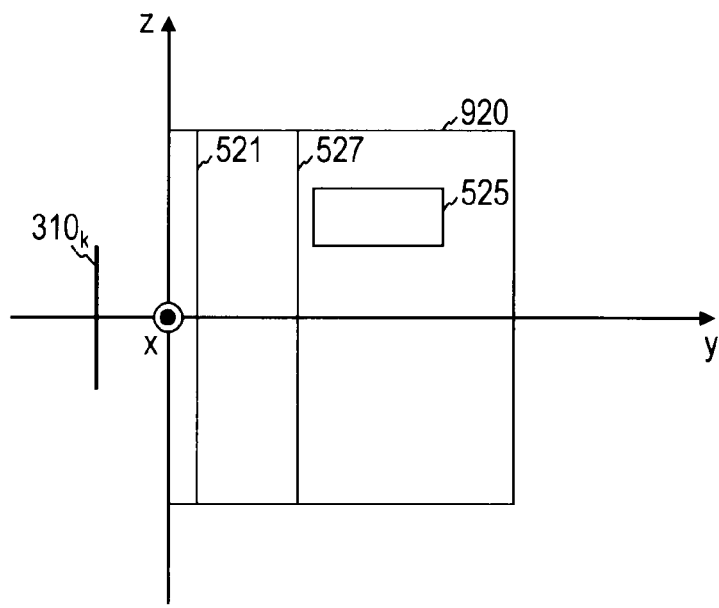
FIG. 13 is a view of FIG. 12 as seen from a direction perpendicular to the yz plane.

The vector r' is a position vector representing the coordinates in the phantom 920. With Equation (1), the three-dimensional distribution of the electric field in the three-dimensional space 920 can be calculated from the electric field distribution $E_{2d}$ for components on the two-dimensional plane parallel to the two-dimensional plane. Also in conversion to wave number space by a Fourier transform or the like, if the amplitudes and phases for two components parallel to the two-dimensional plane and not parallel to each other are measured in the measurement of amplitude and phase of the electric field or magnetic field, the distribution of absorbed power in the three-dimensional space 920 in step S526 can be calculated. Since the orthogonal three-component electric field distribution $E_{est}$ on a measurement plane cannot be calculated, the orthogonal three-component electric field distribution $E_{est}$ on a second plane 527 shown in FIG. 12 is calculated, and from the result, the three-dimensional absorbed power distribution in a deeper location is calculated. From the three-dimensional absorbed power distribution corresponding to given weights, the local average absorbed power corresponding to the given weights can be obtained. FIG. 13 is a view of FIG. 12 as seen from a direction perpendicular to the yz plane. By varying, on a computer, the amplitudes and phases of the transmission powers that the individual antennas can have, the corresponding local average absorbed power (local average absorbed power candidate) is obtained (S535). It is checked whether processing for all predetermined combinations of transmission powers and phases of the individual antennas $310_k$ has been completed (S531). If the result is No in step S531, the processing returns to step S521, and a different combination is determined. If the result is Yes in step S531, the highest one of the obtained local average absorbed powers (local average absorbed power candidates) is specified as the local average absorbed power (S913).

FIG. 8 is a view showing an example of the functional configuration of a local average absorbed power calculating apparatus that executes a part of the processing flow shown in FIG. 9. The local average absorbed power calculating apparatus 505 is given the results of measurement of amplitude and phase of the electric field or magnetic field of each one of the plurality of antennas at the measurement points two-dimensionally disposed in a plane at a given distance from a surface of the phantom (results of step S515) as input values. The local average absorbed power calculating apparatus 505 includes a combining unit 525, a local average absorbed power candidate calculating unit 535, a multiple candidate acquiring unit 531, and a local average absorbed power selecting unit 913. The combining unit 525 applies predetermined weights to the input values and combines them (processing in steps S521 and S525). The local average absorbed power candidate calculating unit calculates the absorbed power distribution in three-dimensional space on the other side of the antennas, as viewed from the two-dimensional plane, in the phantom on the basis of the combined electric field or combined magnetic field obtained by the combining unit 525 (processing in step S526) and obtains the local average absorbed power in the absorbed power distribution corresponding to the weights as a local average absorbed power candidate (processing in step S535). The multiple candidate acquiring unit obtains a plurality of local average absorbed power candidates by repeating the processing of the combining unit 525 and the processing of the local average absorbed power candidate calculating unit 535, while varying the predetermined weights (corresponding to the processing in step S531). The local average absorbed power selecting unit 913 specifies the highest one of the local average absorbed power candidates as the local average absorbed power of the radio device (processing in step S913). In the description given above, the input values given to the local average absorbed power calculating apparatus 505 are the results of measurement at the measurement points disposed two-dimensionally in the plane at the given distance from the surface of the phantom (results of step S515). The input values may also be the amplitudes and phases of the electric fields or magnetic fields at two-dimensionally disposed points, obtained through electromagnetic field simulation, such as the FDTD method.

According to the local average absorbed power measuring method of this embodiment, the local average absorbed power can be obtained on the computer just by first measuring the two-dimensional distributions of the electric fields or magnetic fields formed by the individual antennas. Therefore, the labor is reduced significantly in comparison with a case in which measurements are performed for all combinations of transmission powers and phases of the antennas. If a combination of the equivalence theorem and the mirror theorem or conversion to wave number space by a Fourier transform or the like is applied, measurement of just the two components of the electric field or magnetic field is required, so that the labor can be reduced further, and the apparatus configuration can be simplified. A plurality of local average absorbed power candidates are obtained by not only repeating the processing while varying the combination of transmission powers and phases of the antennas but also repeating also the calculation of the local average absorbed power. Therefore, it is possible to reduce the possibility of missing a combination of transmission powers and phases of the individual antennas that would maximize the local average absorbed power.

Third Embodiment

In this embodiment, a time average of the local average absorbed power is obtained when the actual transmission powers and phases of the individual antennas vary temporally. With the methods and apparatuses in the first and second embodiments, local average absorbed power candidates with respect to the transmission powers and phases of the individual antennas can be obtained. If the ratio of time in that state (ratio of time in that state to total time) is known, by taking the expected value, a local average absorbed power candidate of the time average can be obtained. For example, with a local average absorbed power candidate S1 for combination 1 of transmission powers and phases, a local average absorbed power candidate S2 for combination 2 of transmission powers and phases, and the corresponding states maintained for time periods t1 and t2, respectively, a local average absorbed power candidate that can be obtained by taking account of temporal variations is S1×t1/(t1+t2)+S2×t2/(t1+ t2). In this example, t1+t2 is the total time, and t1/(t1+t2) represents the ratio of time in which the local average absorbed power is S1.

Fourth Embodiment

Figure 14:
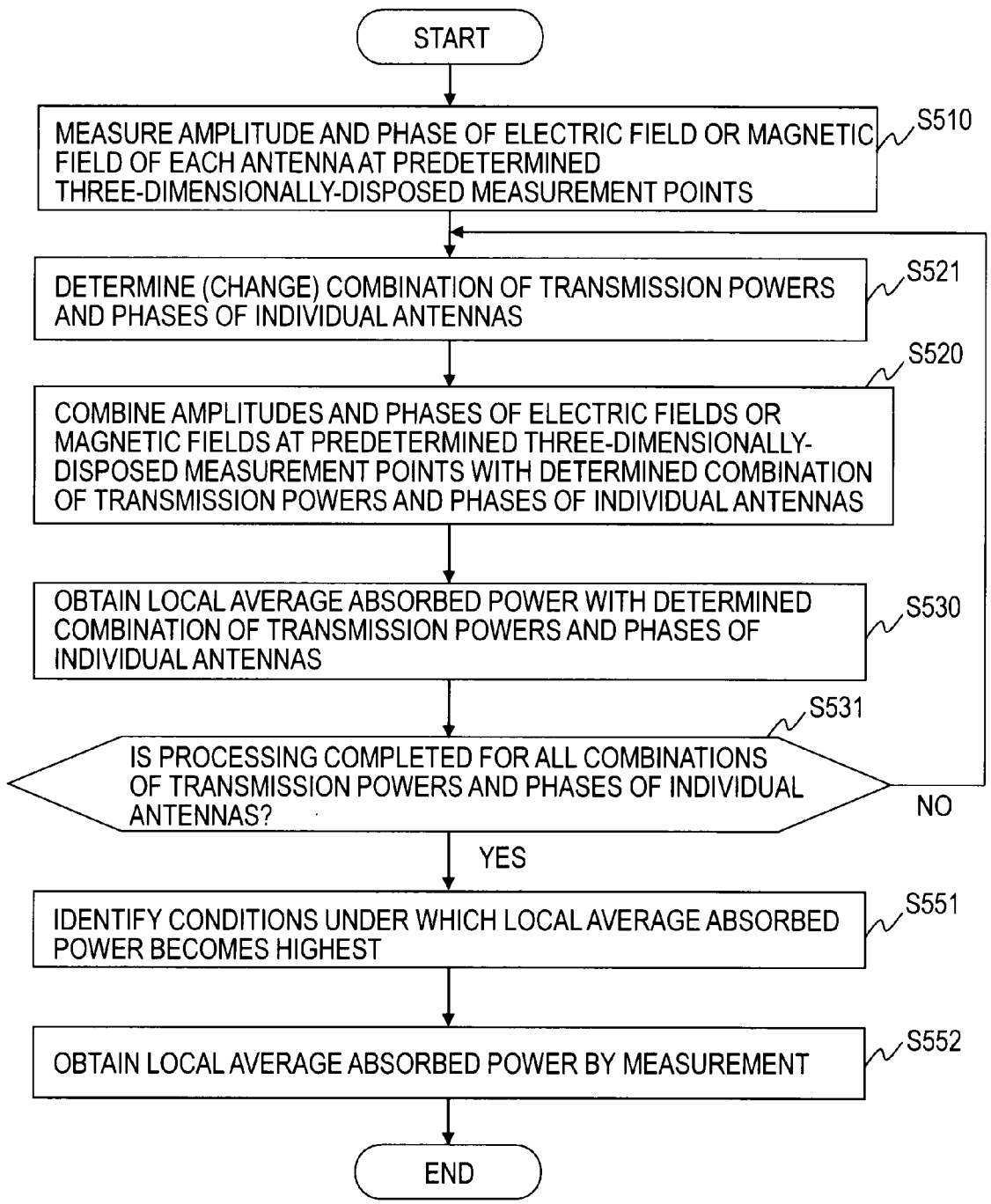
FIG. 14 is a view showing a processing flow in an example of measuring the actual local average absorbed power, following the method in the first embodiment.
Figure 15:
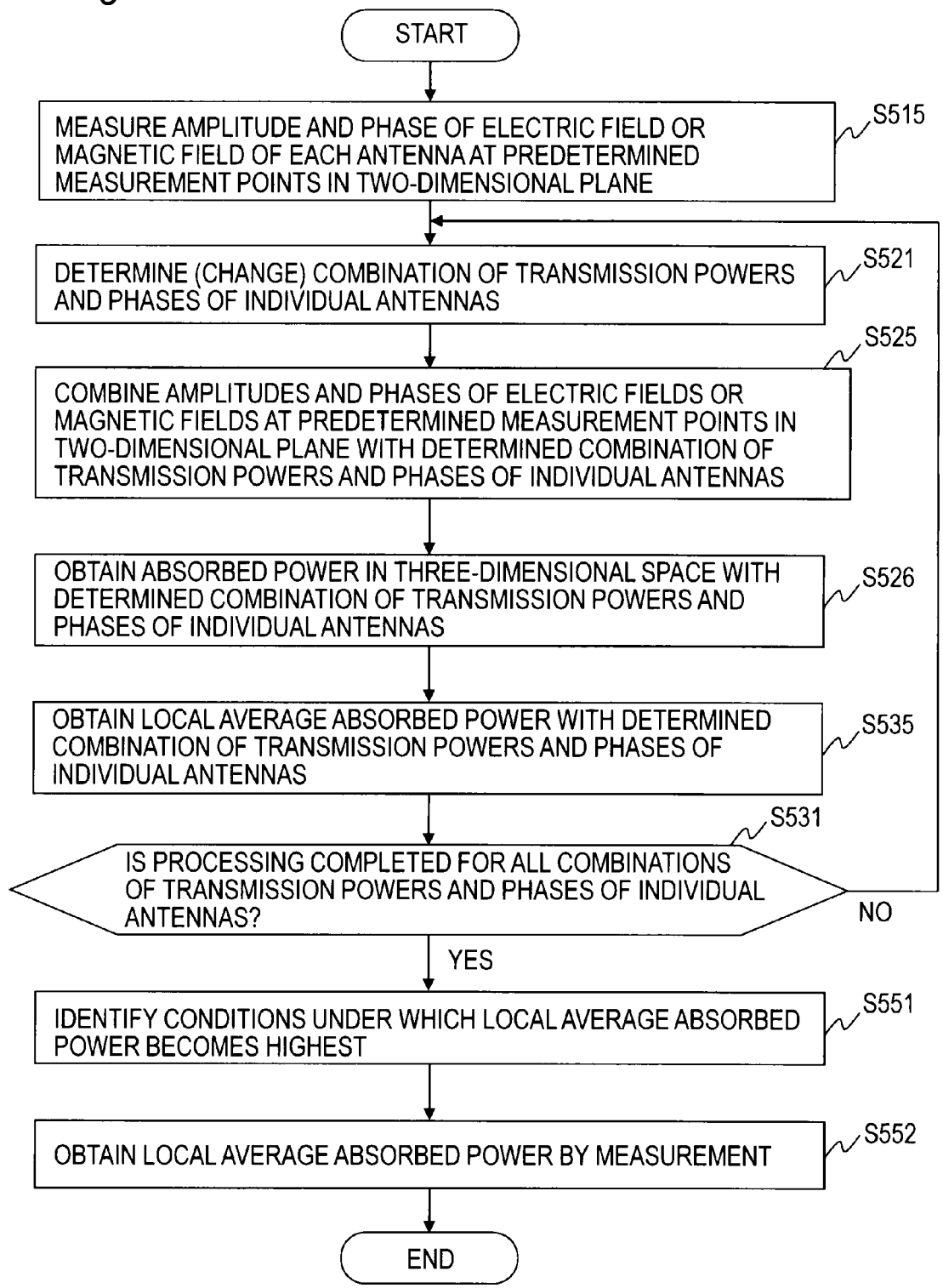
FIG. 15 is a view showing a processing flow in an example of measuring the actual local average absorbed power, following the method in the second embodiment.

In this embodiment, after the transmission powers and phases of individual antennas with which the local average absorbed power can be obtained on a computer are determined, the actual local average absorbed power is measured under the same conditions. FIGS. 14 and 15 show processing flows in this embodiment. FIG. 14 shows an example of measuring the actual local average absorbed power, following the method in the first embodiment, and FIG. 15 shows an example of measuring the actual local average absorbed power, following the method in the second embodiment. In both figures, steps up to step S531 are the same as those in the first embodiment or the second embodiment. In this embodiment, after step S531, conditions under which the local average absorbed power candidate is maximized are identified (S551). Then, the local average absorbed power is obtained by actual measurement under the same conditions (S552). In step S552, the local average absorbed power may be obtained through electromagnetic simulation, such as the FDTD method, instead of actual measurement, under the same conditions.

Figure 16:
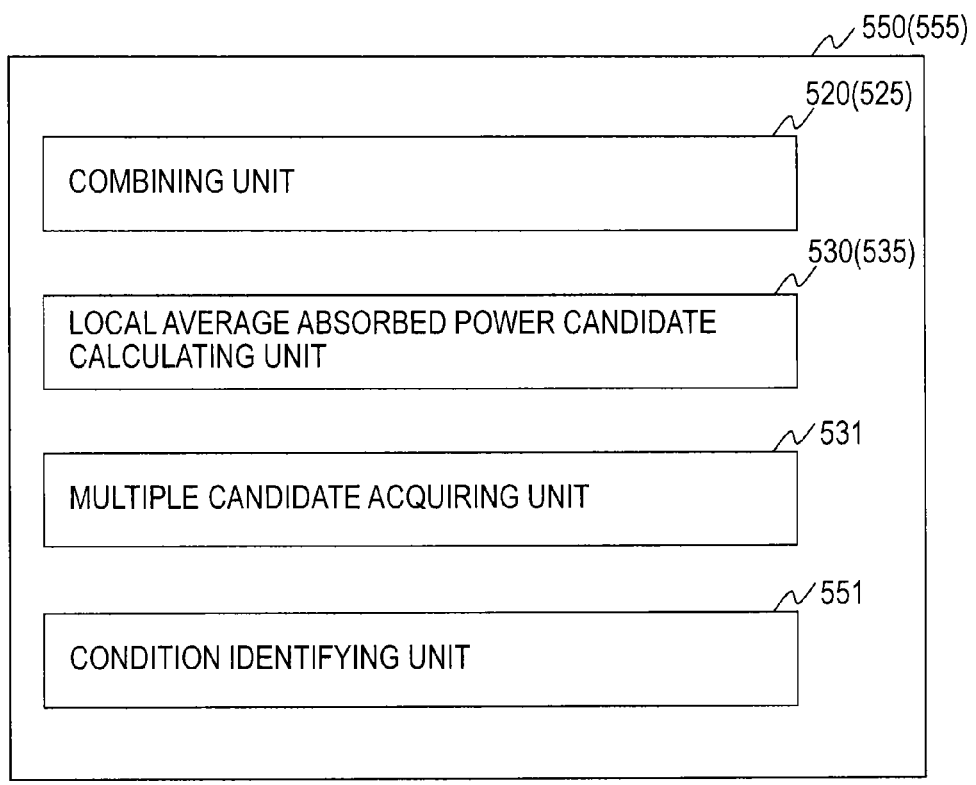
FIG. 16 is a view showing an example functional configuration of a local average absorbed power calculating apparatus that executes a part of the processing flows in FIGS. 14 and 15.

FIG. 16 is a view showing examples of the functional configurations of local average absorbed power calculating apparatuses that execute a part of the processing flows in FIGS. 14 and 15. The local average absorbed power calculating apparatus 550 is a variation of the local average absorbed power calculating apparatus 500 in the first embodiment. The local average absorbed power calculating apparatus 550 includes a combining unit 520, a local average absorbed power candidate calculating unit 530, a multiple candidate acquiring unit 531, and a condition identifying unit 551. The local average absorbed power calculating apparatus 555 is a variation of the local average absorbed power calculating apparatus 505 in the second embodiment. The local average absorbed power calculating apparatus 555 includes a combining unit 525, a local average absorbed power candidate calculating unit 535, a multiple candidate acquiring unit 531, and a condition identifying unit 551. The condition identifying unit 551 identifies conditions under which the local average absorbed power candidate having the maximum value can be obtained (processing in step S551).

Whereas the final local average absorbed power is obtained by calculation in the first embodiment and the second embodiment, the final local average absorbed power is obtained by measurement or electromagnetic simulation in this embodiment, which is helpful when a difference is likely to occur between the theoretical value (calculated value) and the actual measurement value. What it has in common with the local average absorbed power measuring method in patent literature 2 is that the final local average absorbed power is obtained by measurement. However, since the conditions under which the local average absorbed power is maximized are obtained by calculation, the possibility of missing a combination with which the local average absorbed power is maximized can be reduced. Moreover, in this embodiment, measurement is performed with the combination of transmission powers and phases of the antennas only under the conditions with which the local average absorbed power is maximized, so that the number of measurements can be reduced significantly. In the third embodiment, the local average absorbed power S1 and the local average absorbed power S2 may be obtained by actual measurement.

Fifth Embodiment

Figure 17:
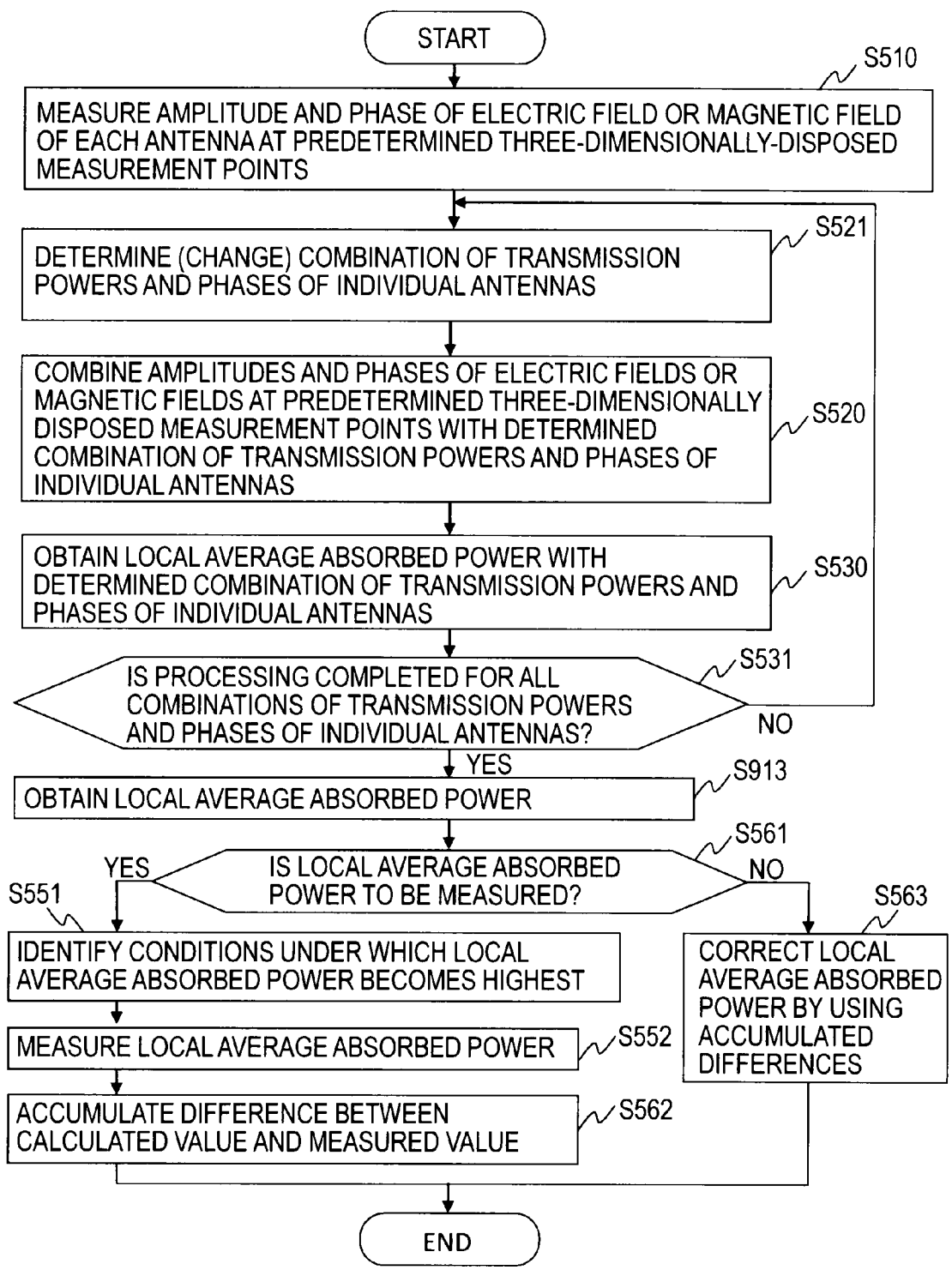
FIG. 17 is a view showing a processing flow of a method of a fifth embodiment, based on the method of the first embodiment.
Figure 18:
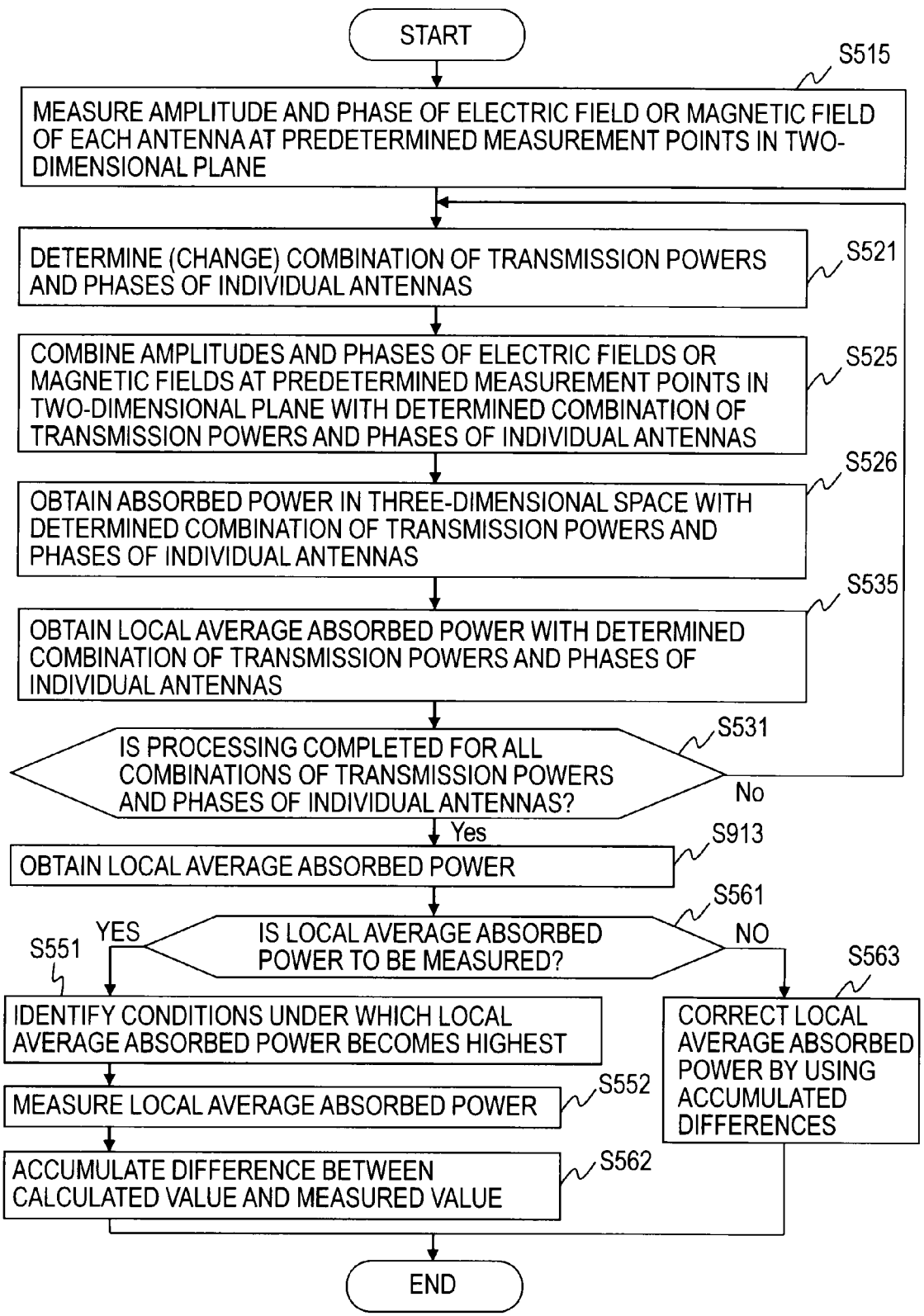
FIG. 18 is a view showing a processing flow of a method of the fifth embodiment, based on the method of the second embodiment.

In this embodiment, the difference between the local average absorbed power obtained by calculation and the local average absorbed power obtained by measurement is accumulated, and once a sufficient amount of difference data is accumulated, the accumulated data is used to correct the local average absorbed power obtained by calculation. Then, after the sufficient amount of difference data is accumulated, even if measurement is omitted, the local average absorbed power can be obtained at the same level of accuracy as that obtained by measurement. FIG. 17 and FIG. 18 show processing flows in this embodiment. FIG. 17 shows an example in which a method of the fifth embodiment is applied to the method of the first embodiment, and FIG. 18 shows an example in which the method of the fifth embodiment is applied to the method of the second embodiment. In both figures, steps up to step S913 are the same as the steps in the first embodiment or second embodiment. In this embodiment, after step S913, it is determined whether to measure the local average absorbed power (S561). More specifically, the Yes-No determination should be made on the basis of whether a sufficient amount of difference data with which the degree of correction needed for the calculated value can be judged has been accumulated. If a sufficient amount of difference data has not been accumulated, Yes is selected, for example, and the conditions that maximize the local average absorbed power candidate are identified (S551). Then, the local average absorbed power is obtained by actual measurement under the same conditions (S552). In step S552, the local average absorbed power may be obtained not by actual measurement but by electromagnetic simulation, such as the FDTD method, under the same conditions. The local average absorbed power obtained in step S552 should be used as the local average absorbed power to be obtained as the result of this processing (final local average absorbed power). Then, the difference between the local average absorbed power obtained in step S913 (local average absorbed power obtained by calculation) and the local average absorbed power obtained in step S552 (local average absorbed power obtained by measurement or electromagnetic simulation) is accumulated in a recording unit (S562). Once a sufficient amount of difference data has been accumulated, No is selected in step S561. Then, the final local average absorbed power is obtained by correcting the local average absorbed power obtained in step S913 (local average absorbed power obtained by calculation). More specifically, the correction should by made by increasing or decreasing the calculated value at a constant ratio or by adding or subtracting a constant value to or from the calculated value. The sufficient amount of accumulated difference data should be determined on the basis of the required measurement accuracy.

Figure 19:
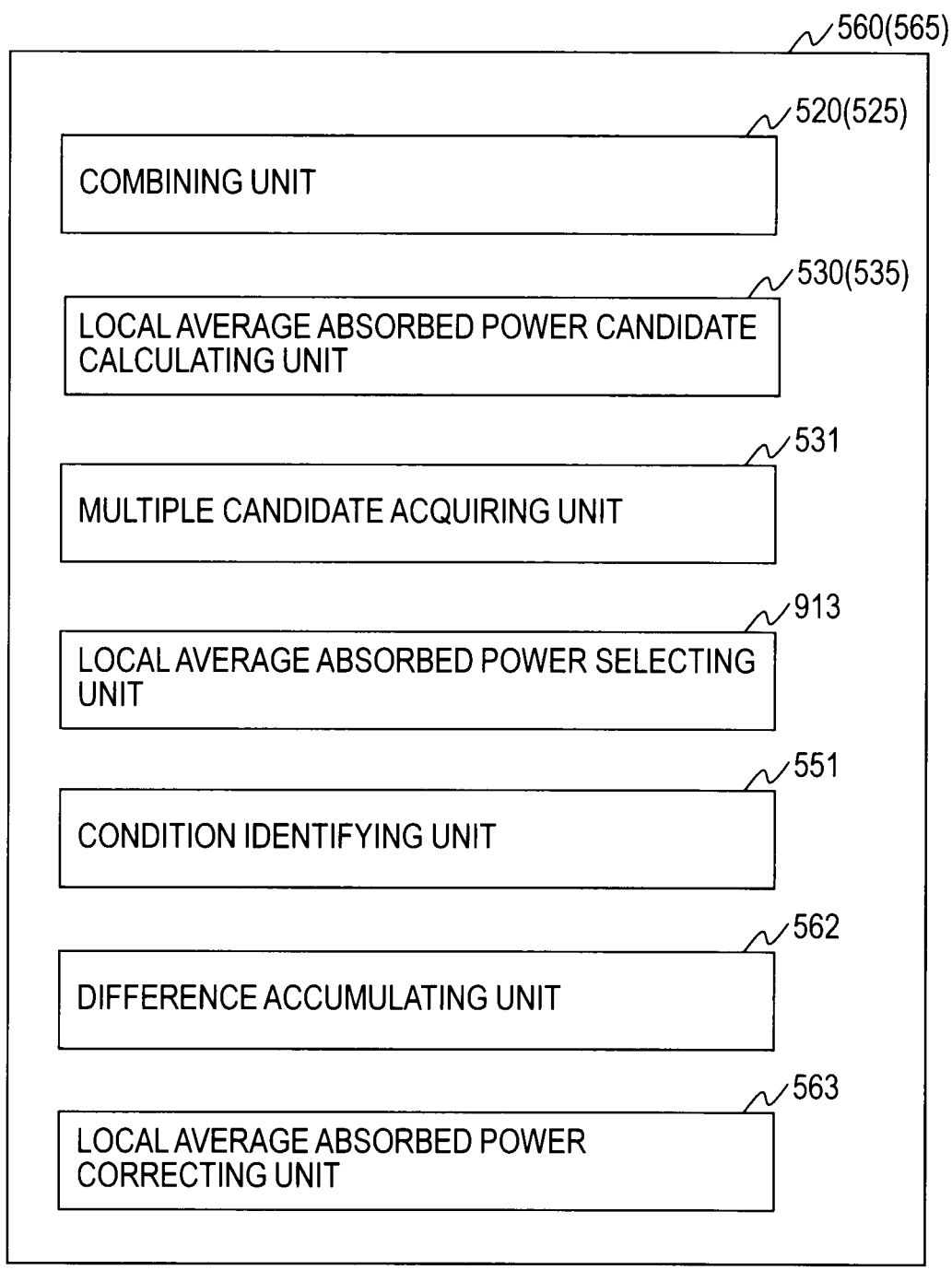
FIG. 19 is a view showing an example functional configuration of a local average absorbed power calculating apparatus that executes a part of the processing flows in FIGS. 17 and 18.

FIG. 19 is a view showing examples of the functional configurations of local average absorbed power calculating apparatuses that execute a part of the processing flows shown in FIGS. 17 and 18. The local average absorbed power calculating apparatus 560 is a variation of the local average absorbed power calculating apparatus 500 in the first embodiment. The local average absorbed power calculating apparatus 560 includes a combining unit 520, a local average absorbed power candidate calculating unit 530, a multiple candidate acquiring unit 531, a local average absorbed power selecting unit 913, a condition identifying unit 551, a difference accumulating unit 562, and a local average absorbed power correcting unit 563. The local average absorbed power calculating apparatus 565 is a variation of the local average absorbed power calculating apparatus 505 in the second embodiment. The local average absorbed power calculating apparatus 565 includes a combining unit 525, a local average absorbed power candidate calculating unit 535, a multiple candidate acquiring unit 531, a local average absorbed power selecting unit 913, a condition identifying unit 551, a difference accumulating unit 562, and a local average absorbed power correcting unit 563. The condition identifying unit 551 identifies conditions under which the local average absorbed power candidate having the maximum value can be obtained (processing in step S551). As difference data, the difference accumulating unit 562 accumulates the difference between the calculated value of the local average absorbed power obtained by the local average absorbed power selecting unit 913 and the measured value obtained by measurement or a value obtained by electromagnetic simulation under the conditions identified by the condition identifying unit 551 (processing in step S562). The local average absorbed power correcting unit 563 corrects the calculated value of the local average absorbed power obtained by the local average absorbed power selecting unit 913 in accordance with the accumulated difference data and specifies the result as the local average absorbed power of the radio device (processing in step S563). In step S561, the determination may be made by the person performing measurement or by the local average absorbed power calculating apparatus 560 (565) in accordance with a predetermined rule.

Whereas the final local average absorbed power is obtained by calculation in the first embodiment and the second embodiment, the final local average absorbed power is obtained by measurement or electromagnetic simulation in this embodiment if there is a small amount of accumulated difference data, and the difference data is accumulated. After a sufficient amount of difference data is accumulated, the local average absorbed power obtained by calculation is corrected in accordance with the difference data, so that this embodiment is helpful when a difference is likely to occur between the theoretical value (calculated value) and the actual measurement value, and the processing can be performed in a shorter time than in the fourth embodiment.

Programs

If the configurations of the local average absorbed power calculating apparatuses 500, 505, 550, 555, 560, and 565 are implemented by a computer, the processing of the functions that should be provided by the apparatuses is written in programs. By executing the programs on a computer, the processing functions are implemented on the computer.

The programs describing the processing can be recorded on a computer-readable recording medium. The computer-readable recording medium can be of any type, such as a magnetic recording device, an optical disc, a magneto-optical recording medium, and a semiconductor memory.

The programs are distributed by selling, transferring, lending a portable recording medium, such as a DVD or a CD-ROM, with the programs recorded thereon. The programs may also be stored in a memory of a server computer and distributed by transferring the programs from the server computer to another computer through a network.

The computer that executes this type of programs first stores in its memory the programs recorded on the portable recording medium or the programs transferred from the server computer. When the processing is executed, the computer reads the programs stored in its recording medium and executes the processing in accordance with the read programs. The programs may be executed in different manners: The computer may read the programs directly from the portable recording medium and may execute the processing in accordance with the programs; alternatively, each time the programs are transferred from the server computer to the computer, the processing may be executed in accordance with the received programs. In some other cases, the programs may not be transferred from the server computer to the computer, and the processing may be executed by a so-called application service provider (ASP) service, in which the processing function is implemented by giving instructions for execution and obtaining the results. The programs in the embodiments include information that is provided for use in processing by a computer and similar to a program (such as data that is not a direct instruction to be given to the computer but has characteristics that specify the processing performed by the computer).

The apparatuses are implemented by executing the specified programs on the computer in the embodiments, but at least a part of the processing may be implemented by hardware.

What is claimed is:

1. A local average absorbed power measuring method for measuring, with an electric and/or magnetic probe, electric field strength or magnetic field strength of radio waves emitted from a radio device to a phantom, which simulates dielectric properties of a human body, the electric and/or magnetic probe being disposed in the phantom, the radio device having a plurality of antennas that emit radio waves of an identical frequency, the local average absorbed power measuring method comprising:

an individual measurement step of measuring amplitude and phase of the electric field or magnetic field of each one of the plurality of antennas at measurement points disposed two-dimensionally in a plane at a given distance from a surface of the phantom; and a calculation step comprising:

a combination sub-step of combining the amplitudes and phases of the electric fields or magnetic fields of the individual antennas obtained in the individual measurement step, with predetermined weights applied thereto; and a local average absorbed power candidate calculation sub-step of calculating a distribution of absorbed power in three-dimensional space on the other side of the antennas, as viewed from the two-dimensional plane, in the phantom from the combined amplitudes and phases of the electric field or magnetic field obtained in the combination sub-step, and obtaining a local average absorbed power in the absorbed power distribution, which corresponds to the weights, as a local average absorbed power candidate; and repeating the combination sub-step and the local average absorbed power candidate calculation sub-step while varying the predetermined weights to obtain a plurality of local average absorbed power candidates.

2. The local average absorbed power measuring method according to claim 1, further comprising a local average absorbed power selection step of specifying the highest one of the local average absorbed power candidates as a local average absorbed power of the radio device.

3. The local average absorbed power measuring method according to claim 1, further comprising:

a condition identification step of identifying conditions under which the local average absorbed power candidate having the highest value can be obtained; and a local average absorbed power measurement step of measuring a local average absorbed power under the conditions and specifying the measured local average absorbed power under the conditions as a local average absorbed power of the radio device.

4. The local average absorbed power measuring method according to claim 1, further comprising:
a local average absorbed power selection step of specifying the highest one of the local average absorbed power candidates as a calculated value of the local average absorbed power;
a condition identification step of identifying conditions under which the local average absorbed power candidate having the highest value can be obtained;
a local average absorbed power measurement step of measuring a local average absorbed power under the conditions and specifying the measured local average absorbed power under the conditions as a measured value of the local average absorbed power;
a difference accumulation step of accumulating a difference between the calculated value of the local average absorbed power obtained in the local average absorbed power selection step and the measured value of the local average absorbed power obtained in the local average absorbed power measurement step, as difference data; and
a local average absorbed power correction step of correcting the calculated value of the local average absorbed power obtained in the local average absorbed power selection step in accordance with the difference data and specifying the corrected calculated value of the local average absorbed power as a local average absorbed power of the radio device.

5. The local average absorbed power measuring method according to claim 1, wherein the distribution of absorbed power in the three-dimensional space on the other side of the antennas, as viewed from the two-dimensional plane, in the phantom is calculated from the combined amplitudes and phases of the electric field or magnetic field by an equivalence theorem, in the local average absorbed power candidate calculation sub-step.

6. The local average absorbed power measuring method according to claim 1, wherein $E_{est}$ is a three-dimensional electric field distribution, $E_{2d}$ is an electric field distribution for components on a two-dimensional plane parallel to the two-dimensional plane, n is a normal vector pointing from the two-dimensional plane, S is the two-dimensional plane,
the distribution of absorbed power in the three-dimensional space on the other side of the antennas, as viewed from the two-dimensional plane, in the phantom is calculated from the combined amplitudes and phases of the electric field or magnetic field by $$E_{est} = -\frac{1}{2\pi}\int_S [\{n \times E_{2d}\} \times \nabla' \phi] dS,$$

where ϕ is a Green function defined by the equation $$\phi = \frac{e^{-jk|r-r'|}}{|r-r'|}$$

and
r' is a position vector representing coordinates in the phantom,
in the local average absorbed power candidate calculation sub-step.

7. The local average absorbed power measuring method according to claim 2, wherein time-average locale average absorbed power candidates which are expected value obtained by using values of the plurality of local average absorbed power candidates and time ratios of the plurality of local average absorbed power candidates are obtained as local average absorbed power candidates, then a highest one of the local average absorbed power candidates is specified as a local average absorbed power of the radio device, in the local average absorbed power selection step.

8. A local average absorbed power measuring method for measuring, with an electric and/or magnetic probe, electric field strength or magnetic field strength of radio waves emitted from a radio device to a phantom, which simulates dielectric properties of a human body, the electric and/or magnetic probe being disposed in the phantom, the radio device having a plurality of antennas that emit radio waves of an identical frequency, the local average absorbed power measuring method comprising:
an individual measurement step of measuring amplitude and phase of the electric field or magnetic field of each one of the plurality of antennas at measurement points disposed three-dimensionally in the phantom; and
a calculation step comprising:
a combination sub-step of combining the amplitudes and phases of the electric fields or magnetic fields of the individual antennas, obtained in the individual measurement step, with predetermined weights applied thereto; and
a local average absorbed power candidate calculation sub-step of calculating a distribution of absorbed power in three-dimensional space from the combined amplitudes and phases of the electric field or magnetic field obtained in the combination sub-step, and obtaining a local average absorbed power in the absorbed power distribution, which corresponds to the weights, as a local average absorbed power candidate; and
repeating the combination sub-step and the local average absorbed power candidate calculation sub-step while varying the predetermined weights to obtain a plurality of local average absorbed power candidates.

9. The local average absorbed power measuring method according to claim 8, further comprising a local average absorbed power selection step of specifying the highest one of the local average absorbed power candidates as a local average absorbed power of the radio device.

10. The local average absorbed power measuring method according to claim 8, further comprising:
a condition identification step of identifying conditions under which the local average absorbed power candidate having the highest value can be obtained; and
a local average absorbed power measurement step of measuring a local average absorbed power under the conditions and specifying the measured local average absorbed power under the conditions as a local average absorbed power of the radio device.

11. The local average absorbed power measuring method according to claim 8, further comprising:
a local average absorbed power selection step of specifying the highest one of the local average absorbed power candidates as a calculated value of the local average absorbed power;
a condition identification step of identifying conditions under which the local average absorbed power candidate having the highest value can be obtained;

a local average absorbed power measurement step of measuring a local average absorbed power under the conditions and specifying the measured local average absorbed power under the conditions as a measured value of the local average absorbed power;

a difference accumulation step of accumulating a difference between the calculated value of the local average absorbed power obtained in the local average absorbed power selection step and the measured value of the local average absorbed power obtained in the local average absorbed power measurement step, as difference data; and a local average absorbed power correction step of correcting the calculated value of the local average absorbed power obtained in the local average absorbed power selection step in accordance with the difference data and specifying the corrected calculated value of the local average absorbed power as a local average absorbed power of the radio device.

12. A local average absorbed power calculating apparatus for calculating local average absorbed power from electric field strength or magnetic field strength of radio waves of an identical frequency emitted to a phantom from a radio device having a plurality of antennas that emit the radio waves, the local average absorbed power calculating apparatus receiving amplitude and phase of the electric field or magnetic field of each one of the plurality of antennas at points disposed two-dimensionally in a plane at a given distance from a surface of the phantom, as input values, the local average absorbed power calculating apparatus comprising:

a combining unit adapted to combine the input values, with predetermined weights applied thereto;

a local average absorbed power candidate calculating unit adapted to calculate a distribution of absorbed power in three-dimensional space on the other side of the antennas, as viewed from the two-dimensional plane, in the phantom, from the combined amplitudes and phases of the electric field or magnetic field obtained by the combining unit, and obtaining the local average absorbed power in the absorbed power distribution, which corresponds to the weights, as a local average absorbed power candidate; and a multiple candidate acquiring unit adapted to obtain a plurality of local average absorbed power candidates by repeating the processing of the combining unit and the processing of the local average absorbed power candidate calculating unit while varying the predetermined weights.

13. The local average absorbed power calculating apparatus according to claim 12, further comprising a local average absorbed power selecting unit adapted to specify the highest one of the local average absorbed power candidates as a local average absorbed power of the radio device.

14. The local average absorbed power calculating apparatus according to claim 12, further comprising a condition identifying unit adapted to identify conditions under which the local average absorbed power candidate having the highest value can be obtained.

15. The local average absorbed power calculating apparatus according to claim 12, further comprising:

a local average absorbed power selecting unit adapted to specify the highest one of the local average absorbed power candidates as a calculated value of the local average absorbed power;

a condition identifying unit adapted to identify conditions under which the local average absorbed power candidate having the highest value can be obtained;

a difference accumulating unit adapted to accumulate a difference between the calculated value of the local average absorbed power obtained by the local average absorbed power selecting unit and a measured value obtained by measurement under the conditions identified by the condition identifying unit or a value obtained by electromagnetic simulation, as difference data; and a local average absorbed power correcting unit adapted to correct the calculated value of the local average absorbed power obtained by the local average absorbed power selecting unit in accordance with the difference data and to specify the corrected value of the local average absorbed power as a local average absorbed power of the radio device.

16. The local average absorbed power calculating apparatus according to claim 12, wherein the distribution of absorbed power in the three-dimensional space on the other side of the antennas, as viewed from the two-dimensional plane, in the phantom, is calculated from the combined amplitudes and phases of the electric field or magnetic field by an equivalence theorem, in the local average absorbed power candidate calculating unit.

17. The local average absorbed power calculating apparatus according to claim 12, wherein $E_{est}$ is a three-dimensional electric field distribution, $E_{2d}$ is an electric field distribution for components on a two-dimensional plane parallel to the two-dimensional plane, n is a normal vector pointing from the two-dimensional plane, S is the two-dimensional plane, the distribution of absorbed power in the three-dimensional space on the other side of the antennas, as viewed from the two-dimensional plane, in the phantom is calculated from the combined amplitudes and phases of the electric field or magnetic field by $$E_{est} = -\frac{1}{2\pi}\int_S [\{n \times E_{2d}\} \times \nabla' \phi] dS,$$

where $\phi$ is a Green function defined by the equation $$\phi = \frac{e^{-jk|r-r'|}}{|r-r'|}$$

and r' is a position vector representing coordinates in the phantom, in the local average absorbed power candidate calculating unit.

18. A local average absorbed power calculating apparatus for calculating local average absorbed power from electric field strength or magnetic field strength of radio waves of an identical frequency emitted to a phantom from a radio device having a plurality of antennas that emit the radio waves, the local average absorbed power calculating apparatus receiving amplitude and phase of the electric field or magnetic field of each one of the plurality of antennas at measurement points disposed three-dimensionally in the phantom, as input values, the local average absorbed power calculating apparatus comprising:

a combining unit adapted to combine the input values, with predetermined weights applied thereto;

a local average absorbed power candidate calculating unit adapted to calculate a distribution of absorbed power in three-dimensional space from the combined amplitudes and phases of the electric field or magnetic field obtained by the combining unit, and obtaining a local average absorbed power in the absorbed power distribution, which corresponds to the weights, as a local average absorbed power candidate; and a multiple candidate acquiring unit adapted to obtain a plurality of local average absorbed power candidates by repeating the processing of the combining unit and the processing of the local average absorbed power candidate calculating unit while varying the predetermined weights.

19. The local average absorbed power calculating apparatus according to claim 18, further comprising a local average absorbed power selecting unit adapted to specify the highest one of the local average absorbed power candidates as a local average absorbed power of the radio device.

20. The local average absorbed power calculating apparatus according to claim 18, further comprising a condition identifying unit adapted to identify conditions under which the local average absorbed power candidate having the highest value can be obtained.

21. The local average absorbed power calculating apparatus according to claim 18, further comprising:

a local average absorbed power selecting unit adapted to specify the highest one of the local average absorbed power candidates as a calculated value of the local average absorbed power;

a condition identifying unit adapted to identify conditions under which the local average absorbed power candidate having the highest value can be obtained;

a difference accumulating unit adapted to accumulate a difference between the calculated value of the local average absorbed power obtained by the local average absorbed power selecting unit and a measured value obtained by measurement under the conditions identified by the condition identifying unit or a value obtained by electromagnetic simulation, as difference data; and a local average absorbed power correcting unit adapted to correct the calculated value of the local average absorbed power obtained by the local average absorbed power selecting unit in accordance with the difference data and to specify the corrected calculated value of the local average absorbed power as a local average absorbed power of the radio device.

22. The local average absorbed power calculating apparatus according to one of claims 13, 15, 19, and 21, wherein time-average local average absorbed power candidates which are expected value obtained by using values of the plurality of local average absorbed power candidates and time ratios of the plurality of local average absorbed power candidates are obtained as local average absorbed power candidates, then a highest one of the local absorbed power candidates is specified as a local average absorbed power of the radio device, in the local average absorbed power selecting unit.

* * * * *